United States Patent [19]

Pauly et al.

[11] Patent Number: 5,150,053
[45] Date of Patent: Sep. 22, 1992

[54] MAGNETIC RESONANCE IMAGING OF SHORT $T_2$ SPECIES WITH IMPROVED CONTRAST

[75] Inventors: John M. Pauly; Steven M. Conolly, both of Menlo Park; Dwight G. Nishimura, Palo Alto, all of Calif.

[73] Assignee: The Board of Trustees of the Leland Stanford Junior University, Stanford, Calif.

[21] Appl. No.: 645,859

[22] Filed: Jan. 25, 1991

Related U.S. Application Data

[63] Continuation-in-part of Ser. No. 386,901, Jul. 28, 1989, Pat. No. 5,025,216.

[51] Int. Cl.⁵ .......................................... G01R 33/20
[52] U.S. Cl. .................................... 324/309; 324/307
[58] Field of Search ............... 324/300, 306, 307, 309, 324/318, 322; 128/653 R, 653 A, 653 AF, 653 SC

[56] References Cited

U.S. PATENT DOCUMENTS

| | | | |
|---|---|---|---|
| 4,625,169 | 11/1986 | Wedeen et al. | 324/309 |
| 4,680,546 | 7/1987 | Dumoulin | 324/307 |
| 4,684,891 | 8/1987 | Feinberg | 324/309 |
| 4,698,592 | 10/1987 | Feinberg | 324/309 |
| 4,698,593 | 10/1987 | Crooks | 324/309 |
| 4,746,863 | 5/1988 | Crooks et al. | 324/309 |
| 4,752,734 | 6/1988 | Wedeen | 324/306 |
| 4,837,513 | 6/1989 | Yao | 324/309 |
| 4,914,392 | 4/1990 | Ugurbil et al. | 324/309 |
| 4,987,369 | 1/1991 | Van Stapele | 324/307 |
| 4,988,947 | 1/1991 | Ugurbil et al. | 324/307 |

Primary Examiner—Michael J. Tokar
Attorney, Agent, or Firm—Townsend and Townsend

[57] ABSTRACT

Magnetic resonance signals for imaging species having short spin-spin relaxation times ($T_2$) are obtained without the need for a refocusing lobe. A series of RF excitation pulses are applied to the species with magnetic resonance signals being detected after each RF excitation pulse is applied. The magnetic resonance signals are then combined to provide the imaging signals. In one embodiment, each RF excitation pulse is half of a conventional slice-selective pulse with each pulse being slewed to zero. Contrast between the imaged short $T_2$ species and longer $T_2$ species can be enhanced by first applying an RF signal having sufficient amplitude to excite the longer $T_2$ species but insufficient amplitude to excite the short $T_2$ species whereby the longer $T_2$ species are tipped by the RF signal. A magnetic gradient can then be applied to dephase the tipped nuclei of the longer $T_2$ species. The imaging signals are then obtained from magnetic resonance signals from the short $T_2$ species.

12 Claims, 15 Drawing Sheets

PULSE

EXCITATION 1

K-SPACE

EXCITATION 2

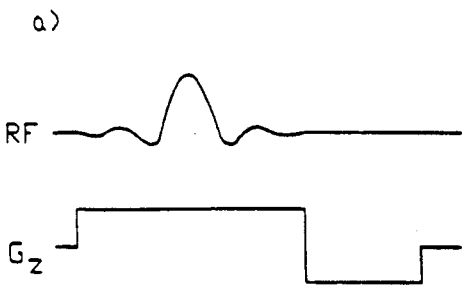
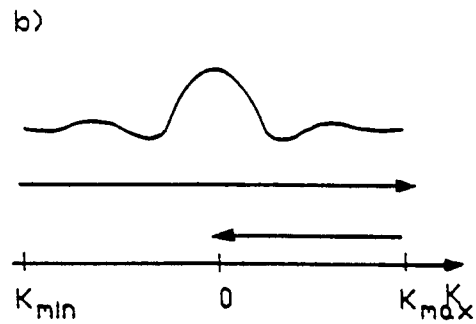
FIG.—4A  FIG.—4B
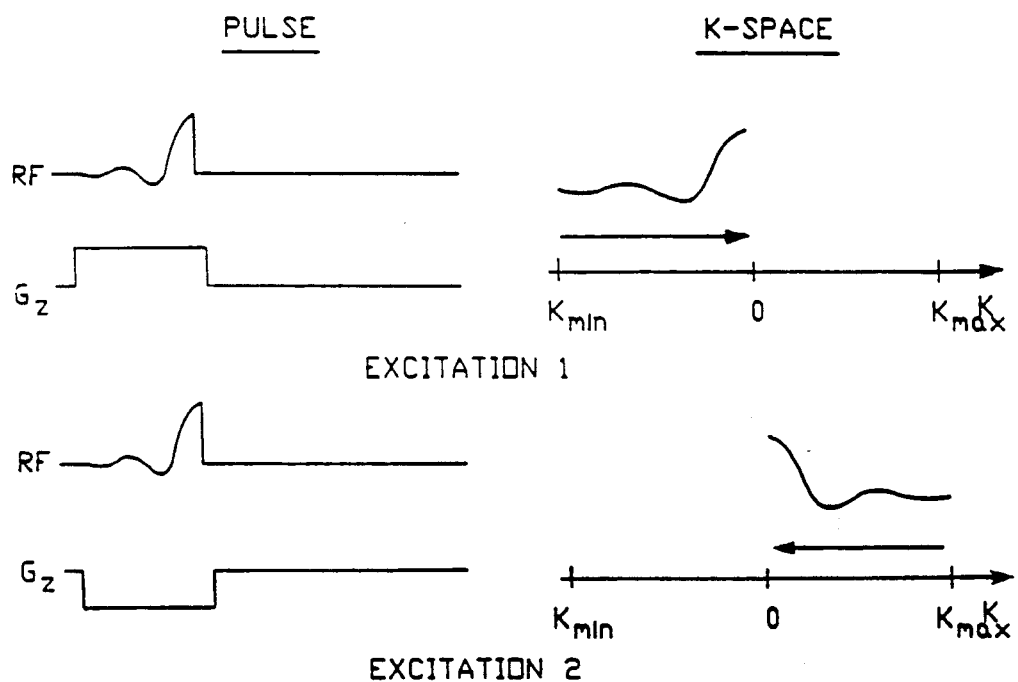
FIG.—5

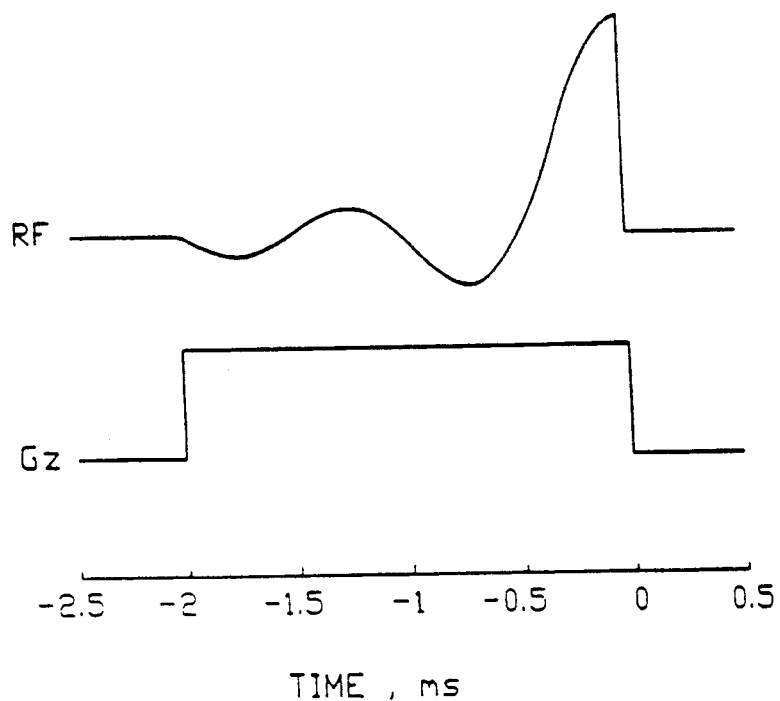
FIG.—9A
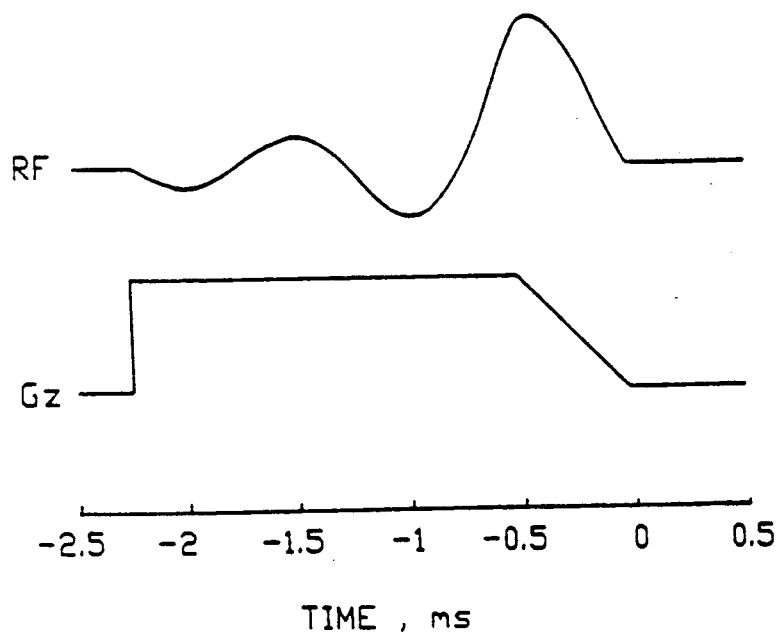
FIG.—9B

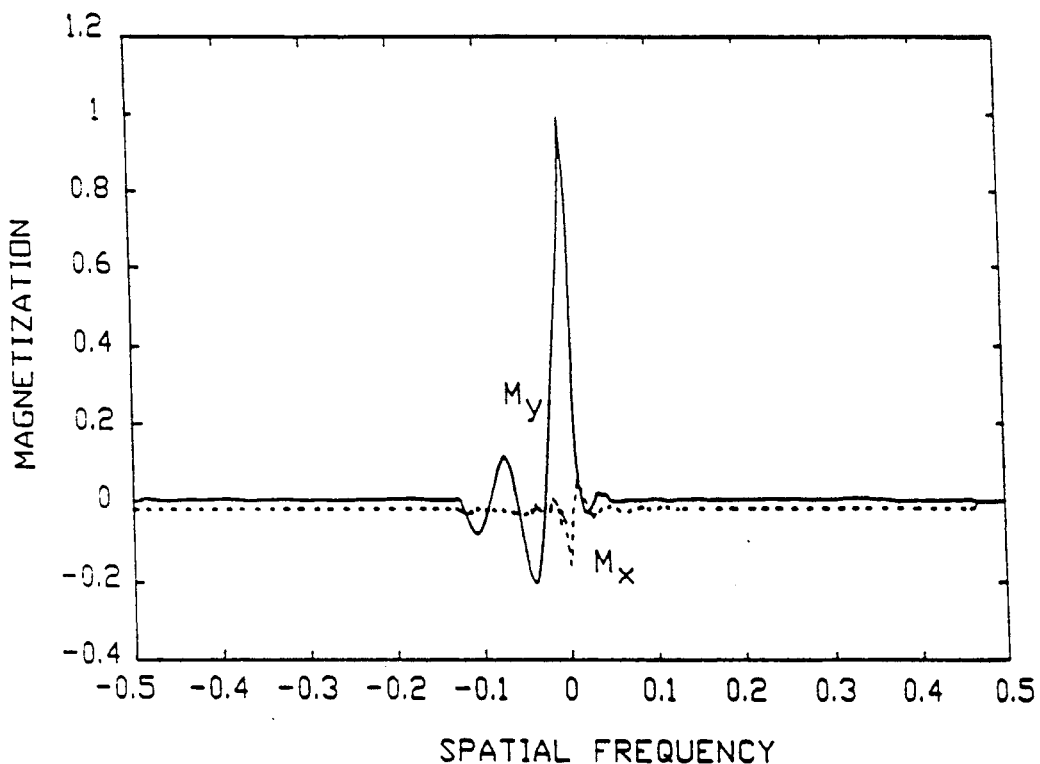
FIG.—11A
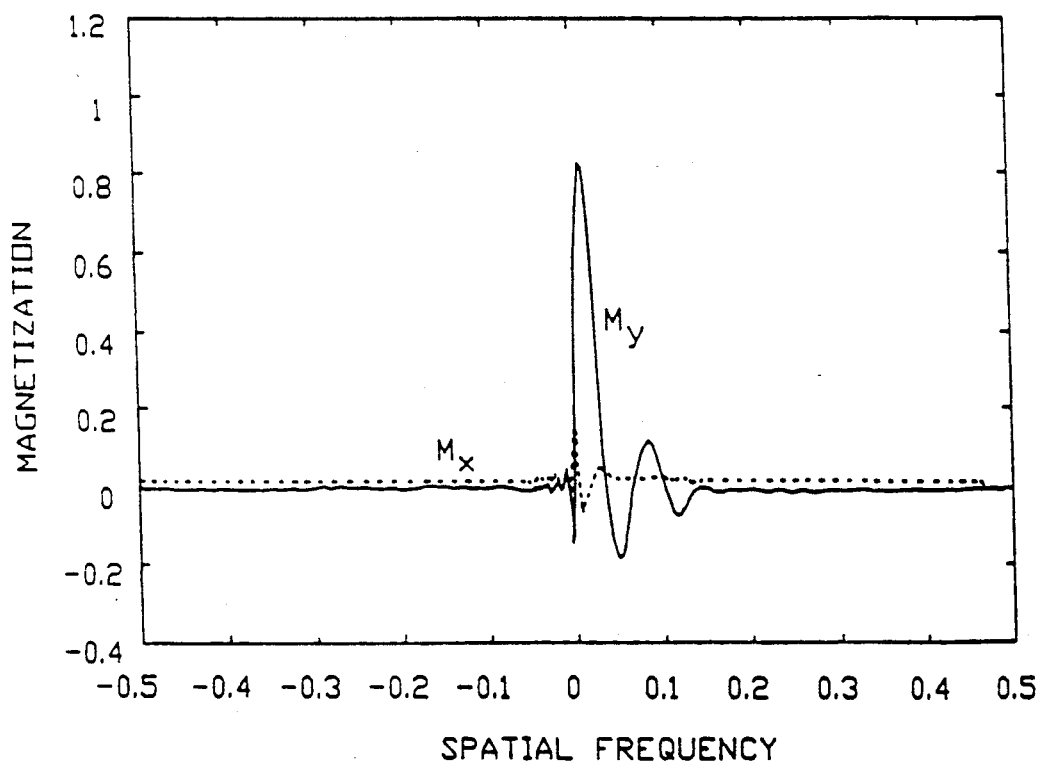
FIG.—11B

250 us DELAY 750 us DELAY

DIFFERENCE IMAGE $T_2$ MAP

MAGNETIC RESONANCE IMAGING OF SHORT T$_2$ SPECIES WITH IMPROVED CONTRAST

The U.S. Government has rights in the disclosed invention pursuant to National Institute of Health grant #1R01HL34962 to Stanford University.

This application is a continuation-in-part of application Ser. No. 07/386,901 filed Jul. 28, 1989 for MAGNETIC RESONANCE IMAGING USING SHORT T$_2$ SPECIES, now U.S. Pat. No. 5,025,216.

BACKGROUND OF THE INVENTION

This invention relates generally to magnetic resonance imaging (MRI) and spectroscopy, and more particularly the invention relates to imaging of species having short spin-spin relaxation times, T$_2$.

Nuclear magnetic resonance (NMR) imaging, also called magnetic resonance imaging (MRI), is a nondestructive method for the analysis of materials and represents a new approach to medical imaging. It is completely non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

A descriptive series of papers on NMR appeared in the Jun. 1980 issue of the *IEEE Transactions on Nuclear Science*, Vol. NS-27, pp. 1220-1255. The basic concepts are described in the lead article, "Introduction to the Principles of NMR," by W. V. House, pp.1220-1226, which employ computed tomography reconstruction concepts for reconstructing cross-sectional images. A number of two- and three-dimensional imaging methods are described. Medical applications of NMR are discussed by Pykett in "NMR Imaging in Medicine," Scientific American, May 1982, pp.78-88, and by Mansfield and Morris, *NMR Imaging in Biomedicine*, Academic Press, 1982.

Briefly, a strong static magnetic field is employed to line up atoms whose nuclei have an odd number of protons and/or neutrons, that is, have spin angular momentum and a magnetic dipole moment. A second RF magnetic field, applied as a single pulse transverse to the first, is then used to pump energy into these nuclei, flipping them over, for example to 90° or 180°. After excitation the nuclei gradually return to alignment with the static field and give up the energy in the form of weak but detectable free induction decay (FID). These FID signals are used by a computer to produce images.

The excitation frequency, and the FID frequency, is defined by the Larmor relationship which states that the angular frequency, $\omega_o$, of the precession of the nuclei is the product of the magnetic field, $B_o$, and the so-called magnetogyric ratio, $\gamma$, a fundamental physical constant for each nuclear species:

$$\omega_o = B_o \cdot \gamma$$

Accordingly, by superimposing a linear gradient field, $B_z = z \cdot G_z$, on the static uniform field, $B_o$, which defines the Z axis, for example, nuclei in a selected X-Y plane can be excited by proper choice of the frequency spectrum of the transverse excitation field applied along the X or Y axis. Similarly, a gradient field can be applied in the X-Y plane during detection of the FID signals to spatially localize the FID signals in the plane. The angle of nuclei spin flip in response to an RF pulse excitation is proportional to the integral of the pulse over time.

A spin echo technique has been employed in obtaining magnetic resonance signals from a body in a non-homogeneous magnetic field. After nuclear spins are tilted and have been processed for a period of time, T, a 180° refocusing RF field is applied to flip the nuclear spins 180°. After a time period of T, the nuclear spins will refocus, at which time the magnetic resonance signals are detected.

However, there is an inherent delay in conventional slice-selective excitation between the peak of the RF waveform when the bulk of the transverse magnetization is created, and the end of the refocusing lobe when data acquisition can begin. Some species to be imaged have short spin-spin relaxation times (T$_2$) after which the free induction signal significantly decays. The minimum T$_2$ species that can be imaged is on the order of this delay time. This delay can be reduced somewhat by using offset RF waveforms and reducing the refocusing time. However the slice profile suffers.

The present invention is directed to providing a method for slice-selective excitation that allows the imaging of very sort T$_2$ species. The invention enhances the image contrast, also.

SUMMARY OF THE INVENTION

An object of the invention is a method and apparatus for slice-selective excitation that allows the imaging of very short T$_2$ species.

Another object of the invention is enhanced contrast in imaging very short T$_2$ species.

A feature of the invention is the use of at least two separate excitations and acquisitions of data with the data summed to provide a signal for a desired slice.

Another feature of the invention is the use of two separate excitations where each excitation corresponds to half of a conventional slice-selective excitation.

Still another feature of the invention is the use of a short T$_2$ contrast preparation RF pulse and magnetic gradient.

Briefly, in one embodiment of the invention two excitations are applied in sequence with data acquisition occurring after the application of each excitation. The two excitations correspond to half of a conventional slice-selective excitation, a sinc pulse for example, and the same acquisition gradients are used for each of the half excitations. The second half excitation is applied after data acquisition is completed for the first half excitation. The data acquisition following each of the excitations are then added to provide a signal for the desired slice.

This method has a number of advantages. First, for long T$_2$ species the slice provide is the same as that for conventional slice selection. No sacrifice in slice profile is required for long T$_2$ species. Second, the slice profile for short T$_2$ species is limited only by T$_2$ and the gradient strength. Third, no refocusing lobe is required. Data acquisition can begin immediately, limited only by the time it takes to shut down the RF transmitter.

To enhance contrast of the short T$_2$ species image, the magnetization of longer T$_2$ species is selectively suppressed by using a contrast preparation pulse which can be followed by a dephasing gradient.

The invention and objects and features thereof will be more readily apparent from the following detailed description and appended claims when taken with the drawings.

BRIEF DESCRIPTION OF THE DRAWING

FIGS. 4A and 4B are a conventional slice-selective excitation and its k-space interpretation, respectively.

FIG. 5 is an excitation pulse in accordance with the invention.

FIGS. 9A and 9B illustrate the ideal gradient and RF waveforms and the corresponding variable-rate waveforms which produce the same sinc weighting of k-space.

FIGS. 11A and 11B illustrate acquired data from the two half k-space excitations with the tip angle being 30°.

DETAILED DESCRIPTION OF ILLUSTRATIVE EMBODIMENTS

Figure 1A:
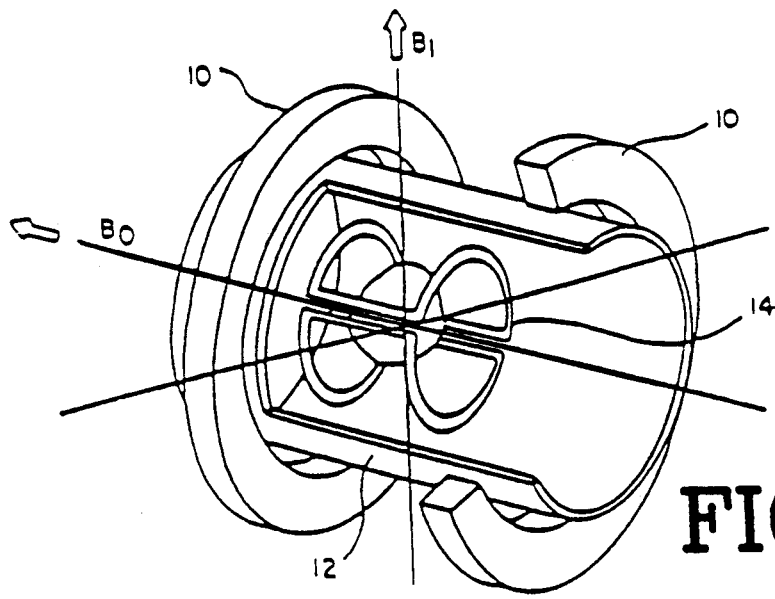
FIGS. 1A–1D illustrate the arrangement of conventional MRI apparatus and magnetic fields generated therein.
Figure 1B:
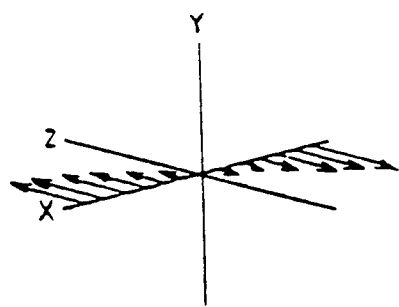
Figure 1C:
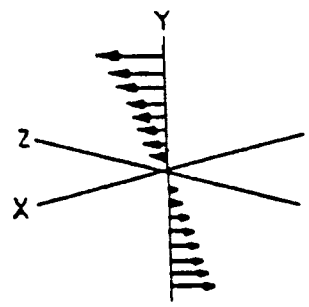
Figure 1D:
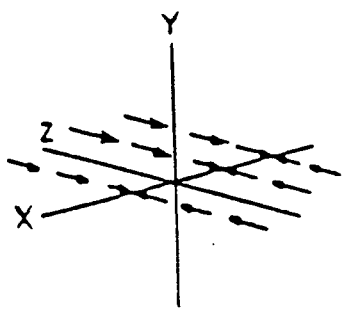

Referring now to the drawings. FIG. 1A is a perspective view partially in section illustrating coil apparatus in an NMR imaging system, and FIGS. 1B–1D illustrate field gradients which can be produced in the apparatus of FIG. 1A. This apparatus is discussed by Hinshaw and Lent, "An Introduction to NMR Imaging: From the Bloch Equation to the Imaging Equation," Proceedings of the IEEE, Vol. 71, No. 3, Mar. 1983, pp. 338–350. Briefly, the uniform static field $B_o$ is generated by the magnet comprising the coil pair 10. A gradient field $G_x$ is generated by a complex gradient coil set which can be wound on the cylinder 12. An RF field $B_1$ is generated by a saddle coil 14. A patient undergoing imaging would be positioned along the Z axis within the saddle coil 14.

In FIG. 1B an X gradient field is shown which is parallel to the static field $B_o$ and varies linearly with distance along the X axis but does not vary with distance along the Y or Z axes. FIGS. 1C and 1D are similar representations of the Y gradient and Z gradient fields, respectively.

Figure 2:
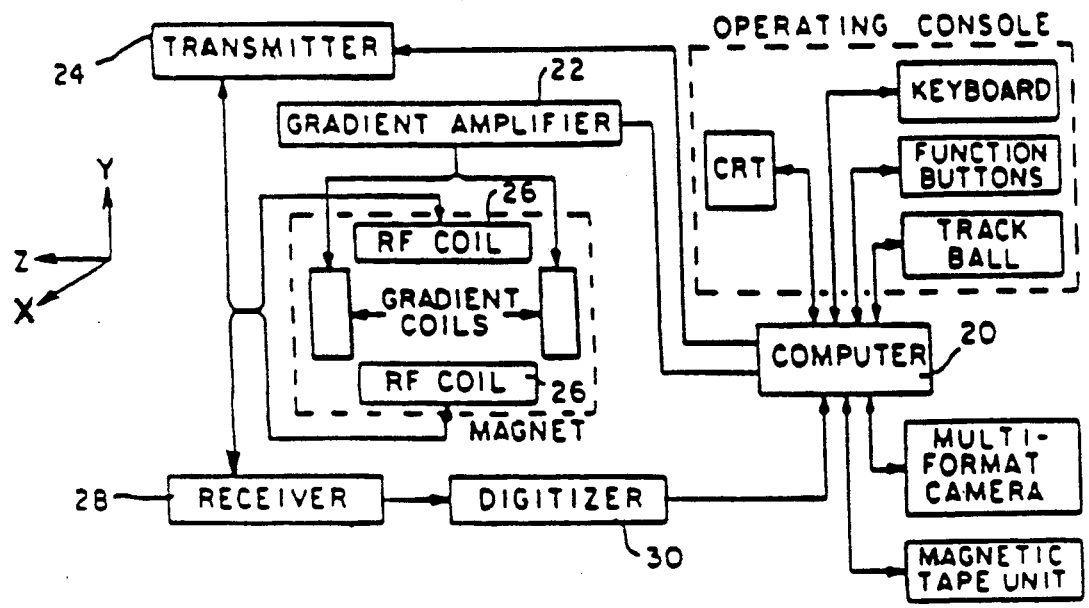
FIG. 2 is a functional block diagram of MRI imaging apparatus.

FIG. 2 is a functional block diagram of the imaging apparatus as disclosed in *NMR - A Perspective on Imaging*, General Electric Company, 1982. A computer 20 is programmed to control the operation of the NMR apparatus and process FID signals detected therefrom. The gradient field is energized by a gradient amplifier 22, and the RF coils for impressing an RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

Figure 3:
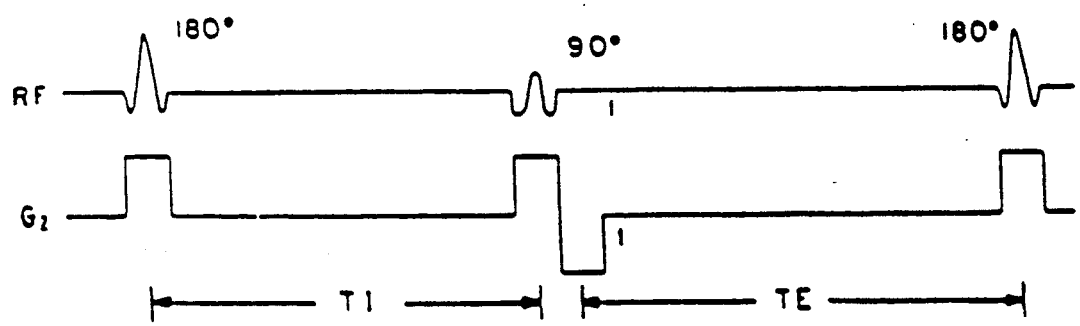
FIG. 3 illustrates a conventional basic pulse sequence for imaging.
Figure 6A:
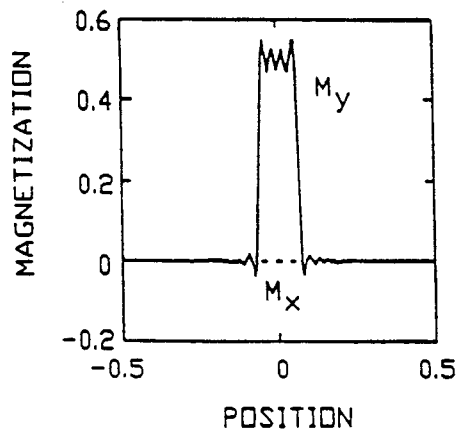
FIGS. 6A–6D illustrate the effect of $T_2$ decay and off-resonance frequency on the slice profile of the short $T_2$ slice-selective pulse.
Figure 6B:
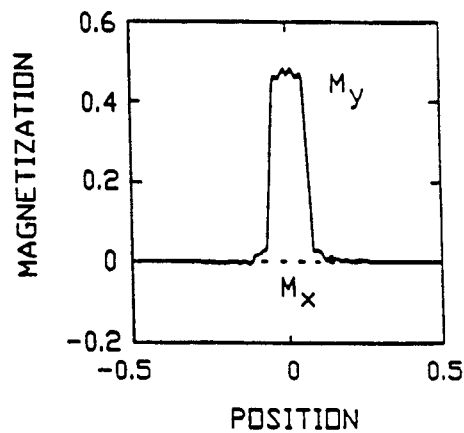
Figure 6C:
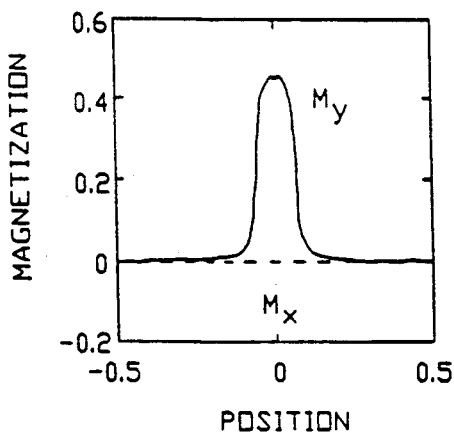
Figure 6D:
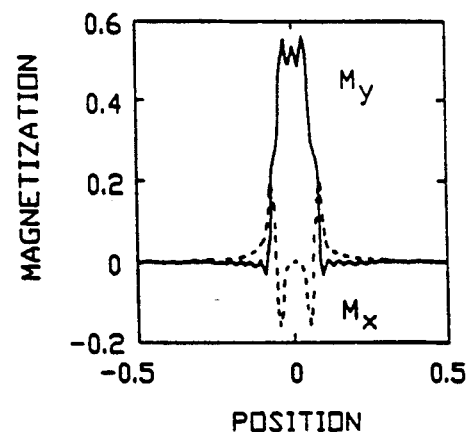

FIG. 3 is a graph illustrating applied RF pulses for a 180° flip angle and a 90° flip angle followed by a "time reversal" 180° pulse and the associated Z axis magnetic field gradient applied during application of the RF pulses. The illustrated pulses are conventional sinc pulses which have front and back lobes with a main RF pulse therebetween.

As noted above, here is an inherent delay in conventional slice-selective spin-warp imaging between the peak of the RF waveform when the bulk of the transverse magnetization is created, and the peak of the echo when most of the energy in the received signal is acquired. This delay is called the echo time $T_E$, and is illustrated in FIG. 6. The minimum $T_2$ species that can be imaged is on the order of this delay time.

This delay can be reduced within the slice-selective spin-warp framework by using an echo off-center in the data acquisition window, and by using an offset RF waveform with a reduced refocussing lobe. The offset echo requires a partial k-space reconstruction, which is not a fundamental problem. The offset RF pulse with the reduced refocussing lobe results in a degraded slice profile. This is fundamental.

Figure 16:
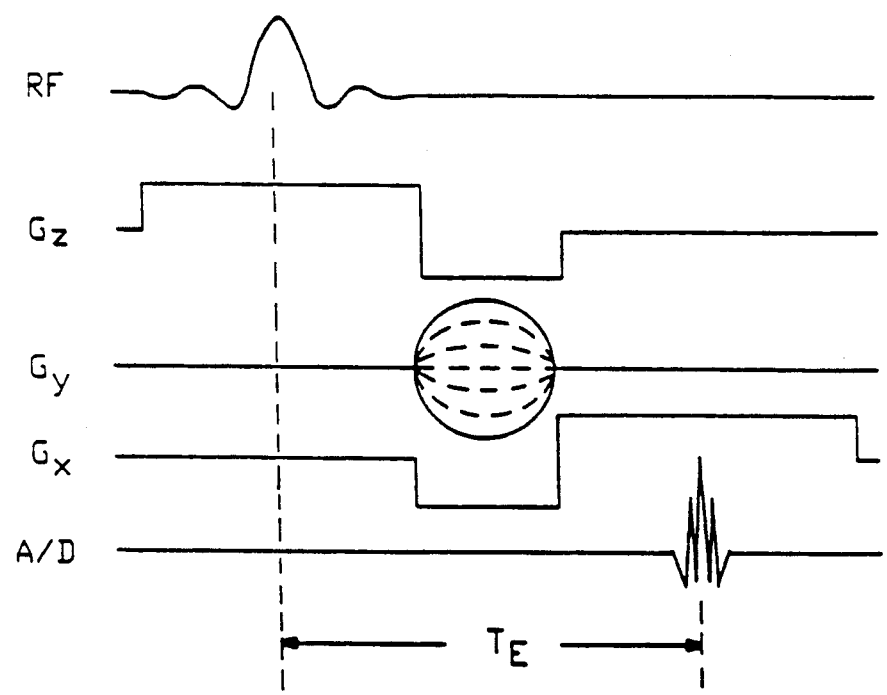
FIG. 16 is a pulse sequence for conventional slice-selective spin-warp imaging.

We propose here a method for slice-selective imaging that allows the $T_E$ to be greatly reduced. The basic idea is that we will simply eliminate that part of the pulse sequence that contributes to $T_E$. These are the second half of the slice select gradient, the refocussing lobe, the phase-encode lobe, the dephaser lobe, and the first half of the readout lobe. In FIG. 16 this corresponds to eliminating everything between the dotted lines. The $T_E$ is then potentially zero, although practical issues limit $T_E$ to a few hundred microseconds on our 1.5T GE Signa System.

There are two problems with this pulse sequence: how to perform data acquisition, and how to perform slice selection. The data acquisition problem is easily solved by using projection-reconstruction readout gradients. Then the low frequency data is always collected immediately. The slice selection problem is the subject of this paper.

The present invention is a method which defines a slice by a sequence of at least two separate excitations. Each of these corresponds to half of a conventional slice-selective excitation. The same acquisition gradients are used for each of these two half excitations, and the signals added. The resulting signal is that of the desired well defined slice.

This slice-selection method has a number of advantages. First, for long $T_2$ species the slice profile is the same as that for conventional slice selection. No sacrifice in slice profile is required for long $T_2$ species. Second, the slice profile for short $T_2$ species is limited only by $T_2$ and the gradient strength. Third, no refocusing lobe is required. Data acquisition can begin immediately, limited only by the time it takes to shut down the RF transmitter.

One disadvantage is some slice profile degradation due to off-resonance effects. This is not usually a significant problem in practice, as we will show in a simulation.

Slice Selective Excitation for Short $T_2$ Species

The proposed pulse is most easily understood in terms of a k-space analysis as described by Pauly, Nishimura and Macovski in *Journal of Magnetic Resonance*, 1989 Vol. 81 pp. 43-56. Based on a small-tip-angle approximation, selective excitation is interpreted as a weighted trajectory through k-space. The slice profile is the Fourier transform of this weighted trajectory. The new excitation pulse may also be viewed as the consequence of the symmetries of the Bloch equation. This approach will be used in a subsequent section when the extension to large-tip-angle pulses is presented.

In conventional slice-selective excitation the k-space trajectory starts at some $k_{min}$, passes through the k-space origin at the peak of the RF, goes to a $k_{max}$, and returns to the origin with the refocusing lobe. See FIG. 4. The pulse sequence we propose scans k-space in two halves, as is illustrated in FIG. 5. The first half excitation starts at $k_{min}$ and ends at the k-space origin, right at the peak of the RF. At this point the read gradients can be applied and data collected. Next the second half excitation is applied, starting at $k_{max}$ and ending at the origin. This is the same as the first excitation, but with a negative gradient. The same read gradients are applied and data collected. The two acquired signals are added. In the absence of $T_2$ decay and chemical shift the resulting signal is the same as that from a conventional slice-selective excitation.

Several advantages have been obtained, however. No refocusing is required. The readout occurs immediately after half of the main RF lobe has been applied. This is when the bulk of the transverse magnetization is created. The "echo time" or $T_E$ can be on the order of the RF transmitter shutdown time — about 200 μs on our GE Signa system. Now the only factors limiting the visibility of short $T_2$ species are the decay during excitation, which limits the sharpness of the slice profile for that species, and decay during readout, which for a given readout gradient limits the resolution with which that species can be imaged.

The dependence of the slice profile on $T_2$ can be shown analytically by introducing a $T_2$ term into the analysis of Ref. Pauly et al., supra. It is more easily seen conceptually. The k-space weighting of high spatial frequencies occurs early in the pulse, and decays away with time constant $T_2$ until data acquisition occurs. The effective RF is then the applied RF weighted by the exponential $T_2$ decay $$B^o{}_1(t) = B_1(t)e^{-|t|/T_2}$$

where the excitation starts at $-T$ and ends at zero. In the small-tip-angle regime the slice profile is the Fourier transform of the weighted k-space trajectory. This will be the infinited $T_2$ slice profile convolved with the Lorenzian line-shape of the short $T_2$ species. For very short $T_2$ species the slice profile will be dominated by $T_2$ decay. Since $\gamma G$ is the velocity through k-space, the product $\gamma G T_2$ is the special frequency at which the k-space weighting has fallen to $1/e$. Its reciprocal $(\gamma G T_2)^{-1}$ is the ultimate 3 dB slice-width achievable for a given $T_2$ and gradient strength.

To illustrate the effect of $T_2$ on slice profile the pulse illustrated in FIG. 2 was simulated with no $T_2$ decay and with $T_2$'s equal to one and two times the component pulse duration. The slice profiles are plotted in FIG. 6. The infinite $T_2$ slice profile is plotted in (a). If the component pulses are 2 ms in length then plots (b) and (c) correspond to $T_2$'s of 2 and 1 ms. The effect of short $T_2$ values is a reduction in the sharpness of the slice profile and some loss in signal.

The short $T_2$ slice-selection pulse has some sensitivity to off-resonance frequency. This minimized by keeping the component pulses short relative to the period of the off-resonance frequency. For example, at 1.5 T the period resulting from 1 ppm inhomogeneity is about 15 ms. Most component pulses will be a factor of 10 shorter than this, causing no problems. The periods resulting from the 3.6 ppm lipid shift is about 4.5 ms. Most component pulses will be half to a quarter of this in length The result is that the slice profile at the lipid frequency will be somewhat degraded Plot (d) in FIG. 6 is the slice profile resulting from the pulse illustrated in FIG. 2 at one-half cycle off-resonance over the duration of the component pulse. This corresponds to an off-resonance frequency of 250 Hz or 3.9 ppm at 1.5 T for 2 ms duration component pulses. There is some moderate degradation in the slice profile In addition there is a constant phase shift that is not shown in the plot.

Extension to Large-Tip-Angle Pulses

The basic idea of adding the data acquired from two separate excitations to define a slice can be extended to large-tip-angle pulses. In this case the analysis is based on the spatial symmetry of the Bloch equation when excited by a real pulse. The spatial response of any real-valued pulse possesses skew-Hermitian symmetry, $$\begin{bmatrix} M_x(-z) \\ M_y(-z) \\ M_z(-z) \end{bmatrix} = \begin{bmatrix} -M_x(z) \\ M_y(z) \\ M_z(z) \end{bmatrix}$$

If we ignore off-resonance effects, then the sum of the original slice and the slice obtained with the gradient negated is $$\begin{bmatrix} 0 \\ 2M_y(z) \\ 2M_z(z) \end{bmatrix}$$

Because the $M_z$ component is not observed, one need optimize only the $M_y$ component of the response when designing an RF waveform.

From this viewpoint off-resonance effects can be considered to be misregistration of the two component slices. An off-resonance frequency corresponds to a spatial shift of $\Delta z = \delta/\gamma G$. This provides another measure of whether off-resonance effects will be significant for a particular pulse. If $\Delta z$ is small relative to the slice width the slice profile degradation should be minimal. The principle contribution to the slice profile degradation will be imperfect cancellation of the $M_x$ components of the slices produced by the two pulses. This is given approximately by $$M_x(z+\Delta) - M_x(z-\Delta z) \approx 2\Delta z \, d/dz \, M_x(z).$$

The new aspect of the pulse design in the large-tip angle regime is the non-linearity of the Bloch equation. There are several computational techniques available for the nonlinear inversion of the Bloch equation. The most general technique is based on optimal control theory. Suppose the RF pulse is a piecewise-constant waveform with N independent values, and that the user has defined a scalar measure of the fitness of a pulse — usually the integrated squared distance between the desired and the achieved slice profile. The optimal control algorithm allows for fast (order N) computation of the gradient of some scalar measure of the fitness of a pulse to the desired task. Once the gradients of the measure are computed, the pulse can be iteratively optimized with any number of nonlinear programming tools. We have used the software package NPSOL, which computes an approximation to the Hessian of the "goodness" measure with respect to each of the points of the RF. The Hessian is used to approximate a second-order optimization algorithm. Convergence is achieved in about 20 iterations.

To exploit the flexibility in $M_x$ and $M_z$ for the interleaved excitation problem discussed here, we employ a measure of goodness that penalizes only the deviation of the $M_y$ from a desired slice. Consider a simple example where in-slice we desire that $M_y$ be close to one, whereas $M_z$ and $M_x$ should be close to zero. Suppose that a certain pulse achieves a magnetization profile at a position with total error in $M_x$ and $M_z$ of magnitude 0.2. Because magnetization length is preserved, the $M_y$ component must be $\sqrt{1-0.2^2} \approx 0.98$. Hence, in this case, a 20% error in two components implies only a 2% error in the other component. This geometrical asymmetry should be exploited in the design of interleaved pulses because we only care about the $M_y$ component in the slice.

Figure 7:
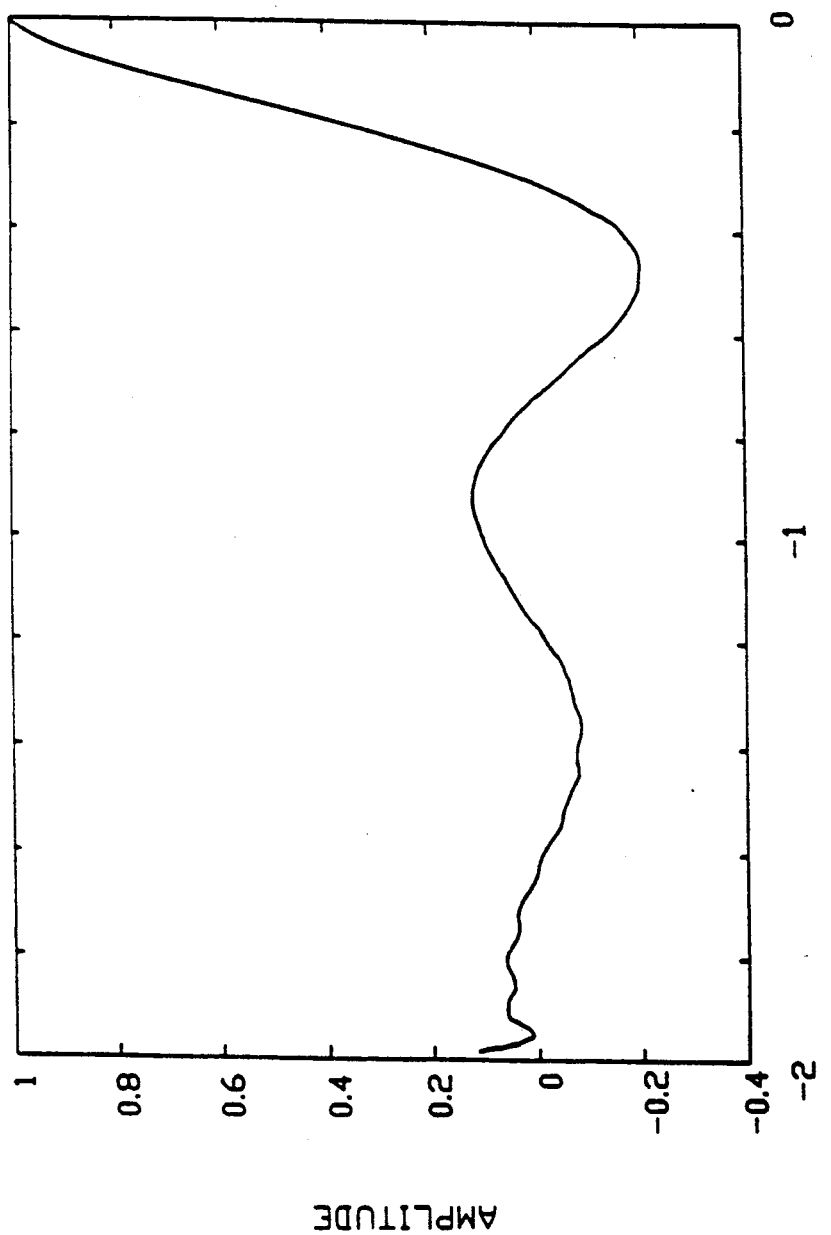
FIG. 7 illustrates an RF waveform for a numerically optimized short $T_2$ pulse with the tip angle designed to be 90°.
Figure 8A:
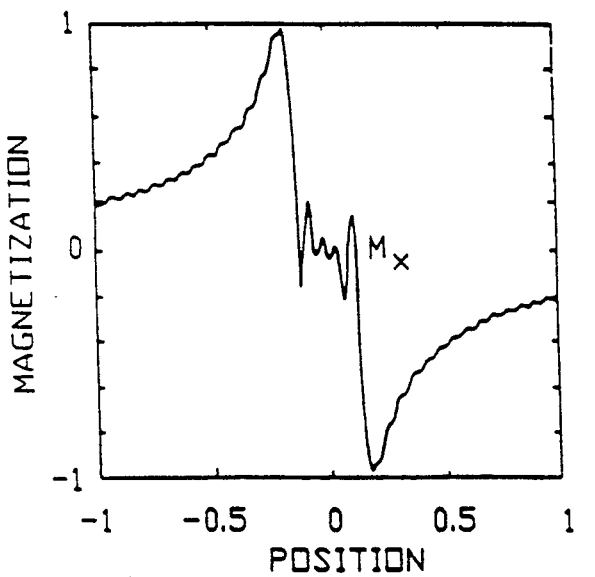
FIGS. 8A–8C are slice profiles for the pulse for FIG. 7.
Figure 8B:
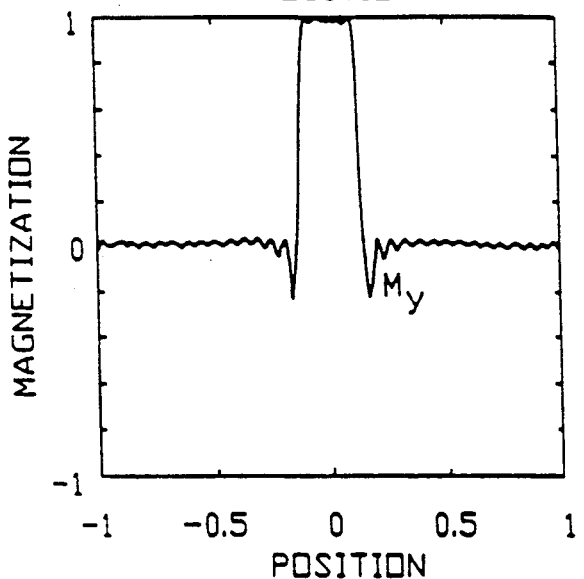
Figure 8C:
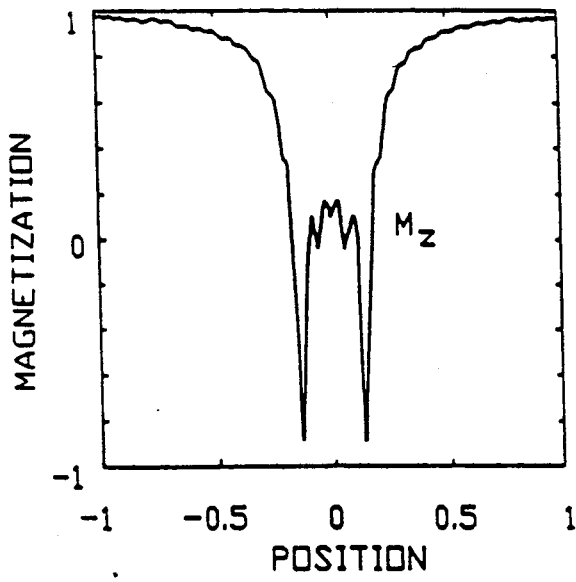

The final design specifications to consider are bandwidth, pulse duration, and slice-edge sharpness. For a fixed-duration pulse, the energy and slice thickness increase with the bandwidth, but the slice profile improves. We settled on a compromise solution with intrinsic bandwidth equivalent to a sinc pulse with 3 zeroes on the left side of the pulse. The initial pulse was chosen by the k-space analysis. The transition regions were unpenalized in the measure of goodness, and the width of the transition was varied. The best pulse is shown in FIG. 7. Its simulated response is plotted in FIG. 8. Only the $M_y$ component contributes to the resultant slice.

Implementation

The excitation pulse as shown in FIG. 5 is difficult to implement. The gradient must go to zero instantly at the end of the RF waveform. In practice the maximum gradient slew rate is limited, on our GE Signa system to 2 G/cm.ms/ A practical gradient would be constant during most of the pulse, and then ramp down to zero at the slew rate limit. There are then two choices. One is that the RF can be confined to the constant part of the gradient waveform. The gradient down-ramp then defocuses the slice, and must be compensated with a small refocusing lobe. This wastes time while the signals of interest are decaying. A better solution is to play the RF during the down-ramp, but to compensate the RF amplitude to insure that the proper k-space weighting is still achieved. This is simply an application of the variable-rate, or VERSE principle. This is the solution we use here. Both the RF waveform and the slice select gradient end at the same time, and data acquisition can start as soon as the RF transmitter can be shut down.

The VERSE calculations for variable-rate-gradient RF pulses are generally done numerically. In this case the gradients are sufficiently simple that the calculation of the required RF waveform may easily be done analytically. Ideally an RF waveform $B_1(t)$ is played in the presence of a gradient with amplitude $G_o$. The gradient switches off instantly at time zero, the end of the pulse. Time and spatial frequency are related by the expression $$k(t) = -\gamma \int_t^0 G(\tau) d\tau. \qquad [2]$$

For this ideal gradient, time and spatial frequency are linearly related $$k(t) = \gamma G_o t \qquad [3]$$

so the RF weighting corresponding to a specific spatial frequency is $B_1(k/\gamma G_o)$.

The gradient we wish to use is initially at $G_o$ and ramps down to zero at the slew-rate limit, reaching zero at time zero. If the slew-rate limit is S the gradient is constant until time $-G_0/S$ and then ramps down linearly. The gradient may be written $$G(t) = \begin{cases} G_0 & t \leq -\dfrac{G_0}{S} \\ -St & -\dfrac{G_0}{S} < t \leq 0 \end{cases} \quad [4]$$

The spatial frequency as a function of time is $$k(t) = \begin{cases} \gamma G_0 \left( t - \dfrac{3G_0}{2S} \right) & t \leq -\dfrac{G_0}{S} \\ -\tfrac{1}{2}\gamma St^2 & -\dfrac{G_0}{S} < t \leq 0 \end{cases} \quad [5]$$

The new RF may now be computed as a change of variables, $$B_1'(t) = B_1\left( \dfrac{k(t)}{\gamma G_0} \right) \left| \dfrac{\dot{k}(t)}{\gamma G_0} \right|. \quad [6]$$

The variable rate RF waveform is then $$B_1'(t) = \begin{cases} B_1\left( t - \dfrac{3G_0}{2S} \right) & t \leq -\dfrac{G_0}{S} \\ B_1\left( \dfrac{St^2}{G_0} \right) \left| \dfrac{St}{G_0} \right| & -\dfrac{G_0}{S} < t \leq 0 \end{cases} \quad [7]$$

The variable-rate gradient and the RF waveforms that produce a sinc k-space weighting are illustrated in FIG. 9, along with the corresponding waveforms for the ideal unrealizable waveforms.

Another practical note is that demodulators used in magnetic resonance imaging often have a DC bias error. This can be suppressed by alternating the sign of the RF on every other excitation, and subtracting each pair. This can also be done at no additional cost for the short $T_2$ slice-selection pulse. Rather than just inverting the gradient on the second component excitation, both the RF and the gradient are inverted. The data corresponding to the two component excitations are then subtracted rather than added.

Experimental Slice Profiles

In this section we present experimental verification of the short $T_2$ selective excitation pulse. This demonstrates several points. First, that the two component excitations do in fact each cover only half of k-space, and that the two halves are complementary. Second, that the variable-rate RF and gradient derived in the previous section do produce the desired k-space weighting. Finally, that the slice profile produced is the one expected analytically.

Figure 10:
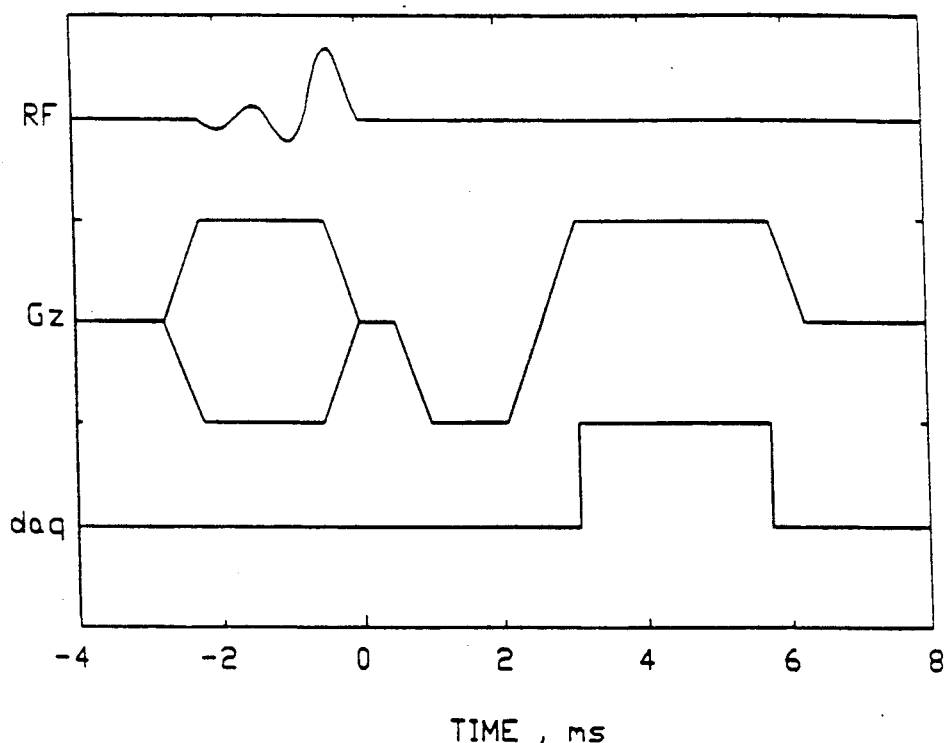
FIG. 10 illustrates pulse sequence for measuring the slice-profile of the short $T_2$ slice-selective pulse.

The pulse sequence used to measure the slice profile is simply the excitation pulse applied along the z-axis, followed by dephase and readout gradient lobes along the same axis. This is illustrated in FIG. 10. The raw data acquired is then the spatial frequency weighting produced by each component excitation pulse. The slice profile is obtained by adding the data from the two component excitations, and computing the Fourier transform of the result.

Sample data from the two component excitations are shown in FIG. 11. Each component excitation only covers half of k-space, ending at the k-space origin. Very little transverse magnetization is created at unexcited spatial frequencies. In this experiment the slice select gradient is only 0.15 G/cm for 2 ms, so that the slice profile can be resolved with a readout gradient of reasonable amplitude and duration. The readout gradient is 0.9 G/cm for 2.66 ms. Data is acquired at 48 kHz, giving 256 samples per acquisition. The RF amplitude was scaled to produce a 30° tip angle on resonance for each of the component pulses. The experiments were performed on a 1.5 T General Electric Signa system, equipped with shielded gradient coils. The standard anti-aliasing filter has been replaced to allow sampling at higher data rates.

Figure 12:
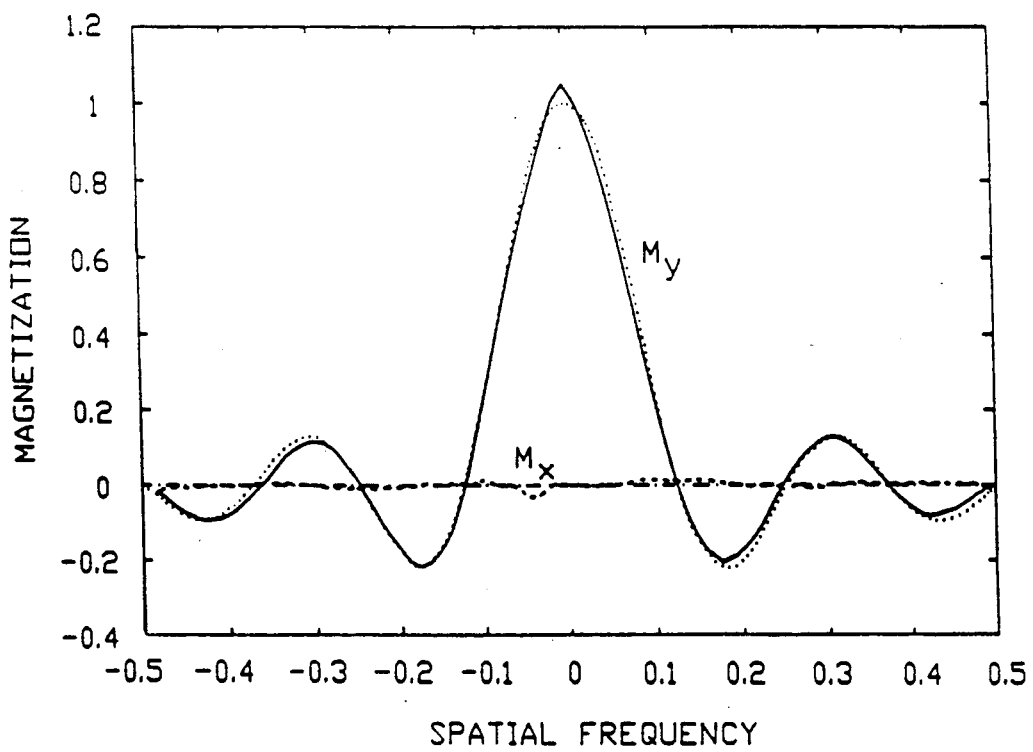
FIG. 12 illustrates a plot of data resulting from adding the two acquisitions in FIGS. 11A and 11B (solid and dashed plots).
Figure 13:
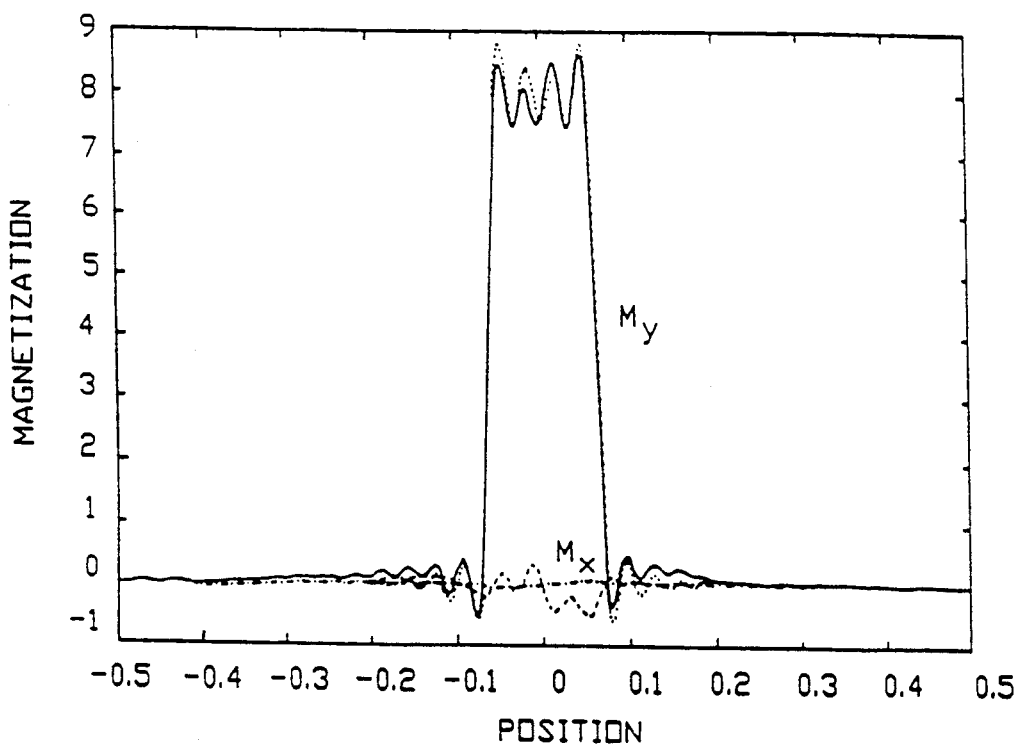
FIG. 13 illustrates a slice profile obtained by transforming the data of FIG. 12 (solid and dashed plots).

The combined data from the two component excitations are shown in FIG. 12, where we have zoomed-in on the excited region of k-space. Also shown is the theoretical sinc k-space weighting, scaled to match the width and amplitude of the acquired data. The agreement is quite good. The experimental slice profile is obtained by performing a Fourier transform of the acquired data of FIG. 12. The result is shown in FIG. 13, along with the Fourier transform of the sinc weighting. Again the agreement is quite good. The slice width at half amplitude is 2.7 cm. The ripple in the passband of the pulse is due to the choice of a sinc RF pulse. Any other RF waveform could be substituted.

Experimental Short $T_2$ Images

In the previous section we have demonstrated that the proposed slice selection method does produce the expected slice profile. Here we demonstrate it's utility for imaging short $T_2$ species.

The pulse sequence used in this section is simply the proposed slice selective excitation pulse followed by a projection-reconstruction acquisition gradient sequence. The reason for using the projection-reconstruction sequence is that data can be collected immediately, starting at low frequencies. Moderate $T_2$ decay during acquisition will reduce resolution, but not the imaged signal level of a short $T_2$ species.

As was the case for the excitation gradient, the read gradients cannot change levels instantly. Gradient ramps must be introduced to keep the slew rates within the capabilities of the gradient amplifiers. In this case the gradients start at zero and ramp up to the desired read levels. The slew rate is chosen so that the slew-rate limit is reached when the read gradient falls along one of the gradient axes.

The low frequency data is acquired on the up-ramp of the read gradients. This corresponds to non-uniform sampling of k-space. The reconstruction algorithm compensates both for this non-uniform sampling, as well as the polar-to-rectangular mapping inherent in projection-reconstruction data collection. For the reconstructed images the reconstruction algorithm consists simply of mapping each point in the desired rectangular grid into the acquired projection-reconstruction data, and interpolating to find a data value. The resulting rectangular data grid is then transformed to produce an image.

Figure 14:
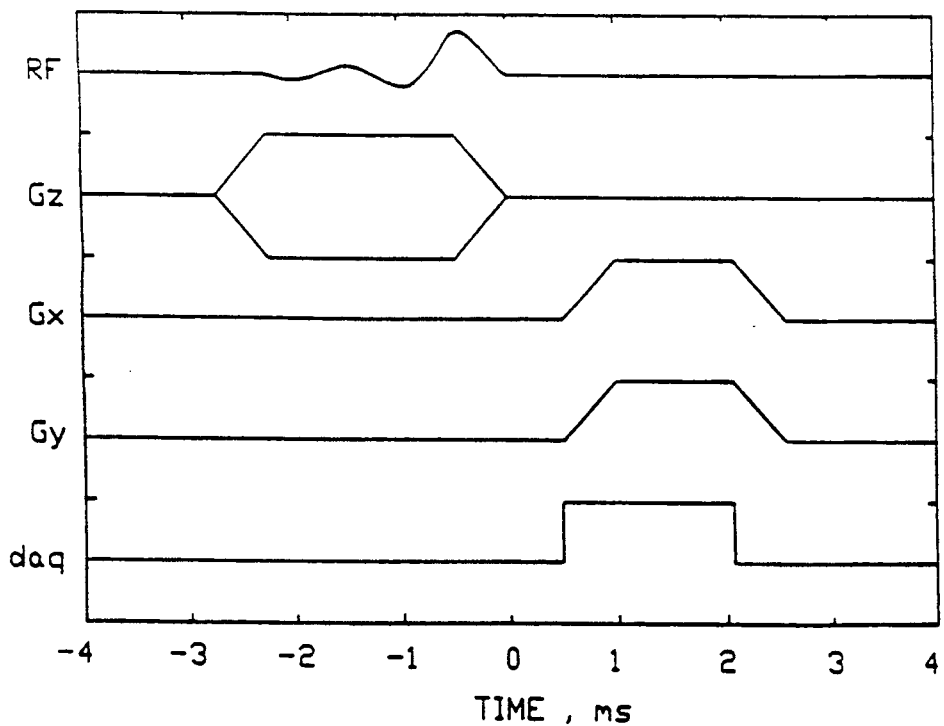
FIG. 14 illustrates a pulse sequence used to image short $T_2$ species in which the proposed selective excitation pulse is followed immediately by projection-reconstruction acquisition gradients.
Figure 15A:
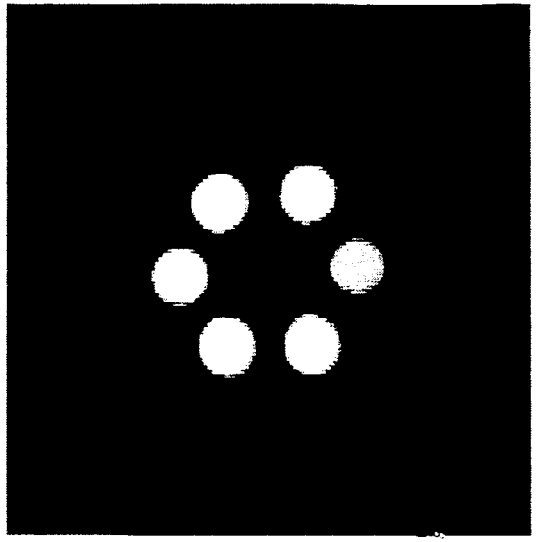
FIGS. 15A–15D are cross-sectional images of six test tubes containing MnCl solutions with $T_2$'s of 20, 20, 5, 3, 2, and 1 ms.
Figure 15B:
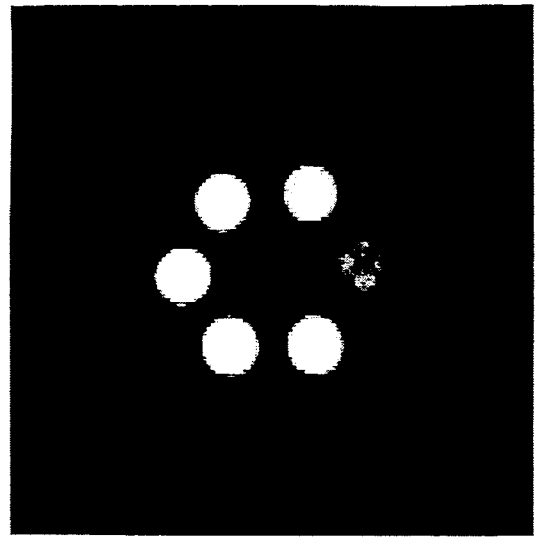
Figure 15C:
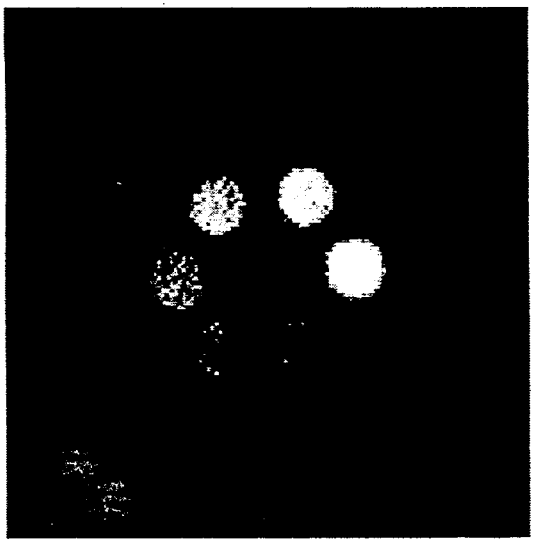
Figure 15D:
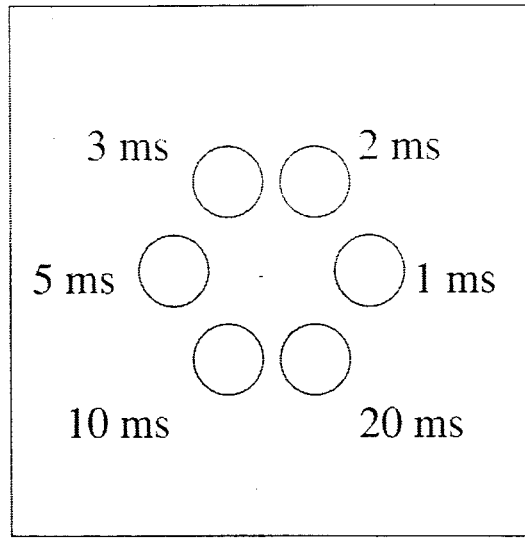

The pulse sequence is illustrated in FIG. 14. There is a delay between the end of the excitation pulse and the beginning of the read gradients. This is can be adjusted to introduce a specific $T_2$ weighting.

The images in FIG. 15 are a cross-section through six test tubes, each containing MnCl solutions with different $T_2$'s. The $T_2$'s are 20, 10, 5, 3, 2, and 1 ms, arranged as illustrated in the lower right. The slice thickness is 7 mm, the field of view of 24 cm, and data collection is 1.58 ms in duration at a rate of 48 kHz. The images are reconstructed on a 256 by 256 grid and have a resolution of slightly better than 1 mm. Only the central 12 cm of the images are shown. The upper two images were acquired using two different delay times between the end of the RF pulse and the beginning of the read gradients and data acquisition: 250 $\mu$s in the upper left image and 750 $\mu$s in the upper right image. Both images clearly show all the different $T_2$ solutions. Only the 1 ms solution shows a significant reduction in signal intensity.

An image that is selective for short $T_2$ species may be formed by subtracting these two images. The result is shown in the lower left image. The 1 ms test tube is the brightest, while the 10 and 20 ms test tubes are barely visible. This method only works when the object has only a single spectral component. With more than one spectral component, such as water and lipid, the signals from the various components will interfere differently at the two different delay times. This will produce a contribution to the difference image even in the absence of $T_2$ decay. A more sophisticated approach is required in this case.

Image Contrast

A problem with the above-described imaging method is that all species with $T_2$'s longer than a few hundred microseconds show up with equal intensity; there is no $T_2$ contrast. We would like an image primarily of the short-$T_2$ species. This would allow the identification of structures rendered visible by the new short-$T_2$ imaging method, and the ability to directly image these species will be of considerable utility for medical diagnoses. Some of the possible tissues of interest are bone, the dura mater which separates the brain from the skull, myelin which forms the lining of nerves and is present in significant quantities in brain white matter, and the fibrose components of atherosclerotic plaques.

Figure 17:
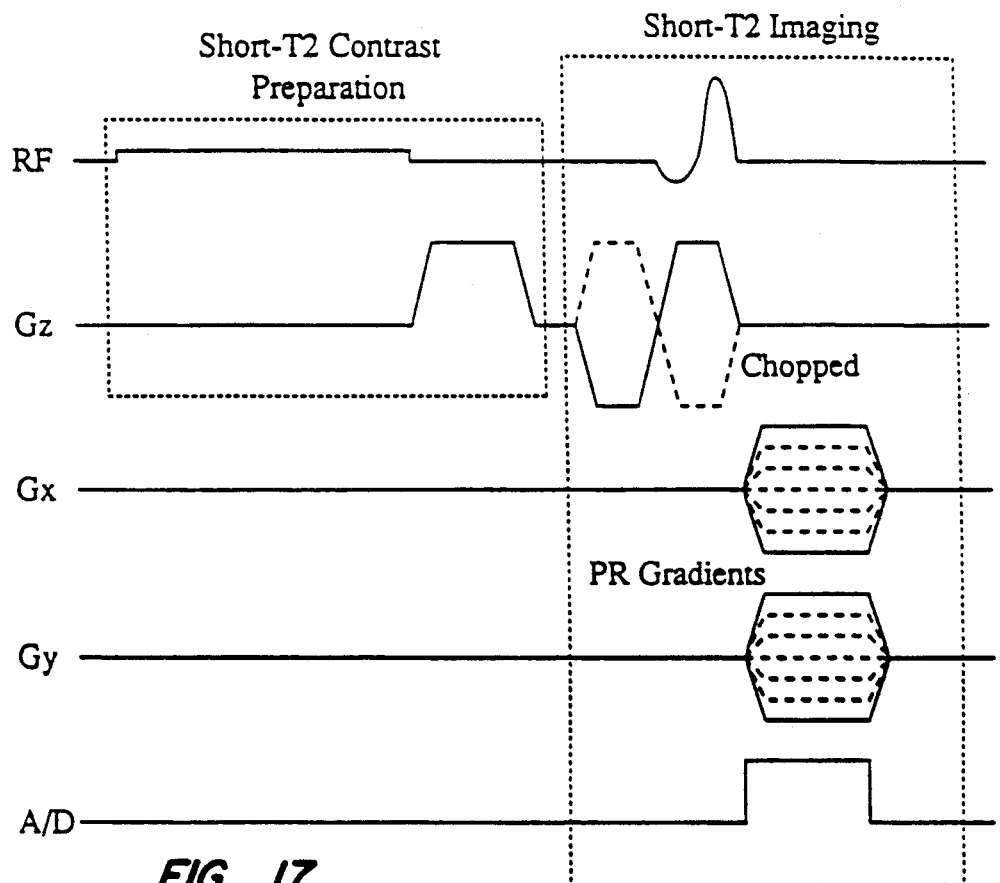
FIG. 17 illustrates the use of a short $T_2$ contrast preparation pulse and dephasing gradient prior to the short $T_2$ imaging thereby enhancing the contrast in an image.

In producing images with short-$T_2$ contrast, initial contrast preparation pulses are used to selectively suppress the magnetization from long-$T_2$ species. This is followed by the short-$T_2$ imaging sequence described above. The basic pulse sequence is illustrated in FIG. 17.

One method described above, for creating short-$T_2$ contrast images uses two images, one with an additional delay between excitation and acquisition. This delay allows short-$T_2$ species to decay somewhat. Subtracting the two images produces an image showing the species that have decayed during the delay. This method has several problems. In order to suppress long-$T_2$ species the delay must be fairly short (1 ms or less). This also results in significant suppression of short-$T_2$ species, which is highly undesirable. In addition, the subtraction method is sensitive to subject motion. It also has problems when multiple chemical components (like water and lipids) are within a voxel. This is due to the destructive interference between their signals appearing as $T_2$ decay.

Image contrast in accordance with the present invention avoids all of these problems. Short-$T_2$ components are almost completely unsuppressed by the short-$T_2$ contrast preparation pulse. The extent of the suppression is a function of $T_2$, as will be discussed below. The full magnetization of the short-$T_2$ species is available for imaging. Since it is not based on subtraction, it is not affected by subject motion. The method can work with any combination of chemical species by properly designing the contrast preparation pulse.

Figure 18:
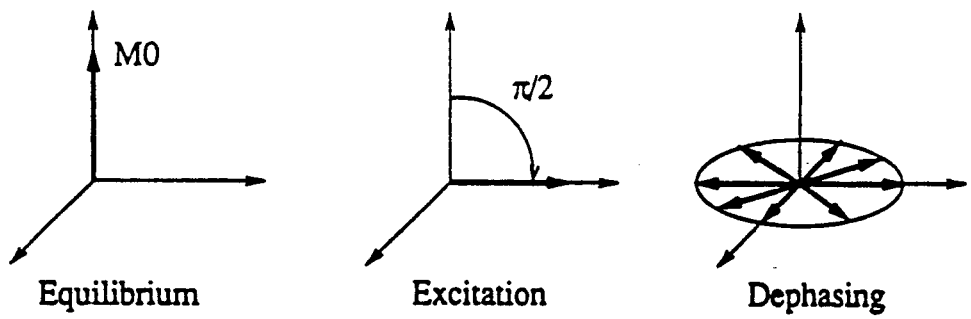
FIG. 18 illustrates the suppression of Z axis magnetization of long $T_2$ species and dephasing thereof using the contrast preparation pulse and dephasing gradient of FIG. 17.
Figure 19:
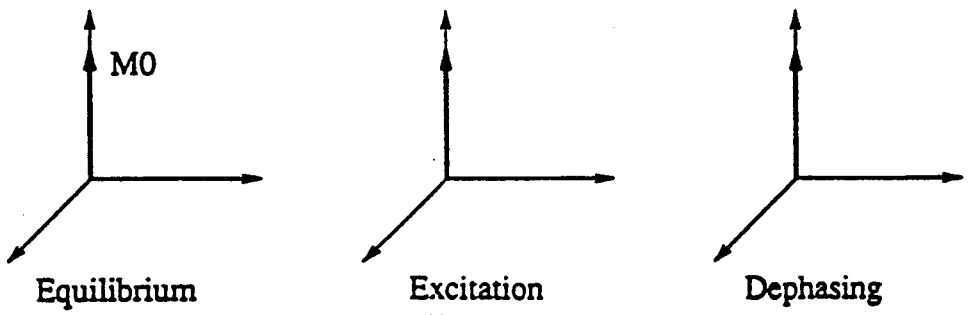
FIG. 19 illustrates the lack of suppression of Z axis magnetization of short $T_2$ species using the contrast preparation pulse and dephasing gradient of FIG. 17.

The basic idea behind the short-$T_2$ contrast preparation pulses is that it is easy to excite long-$T_2$ species while it is difficult to excite short-$T_2$ species. This is illustrated in FIGS. 18 and 19. FIG. 18 illustrates the case of long-$T_2$ species. A long, low amplitude, excitation pulse rotates long-$T_2$ species from their initial position along the $+z$ axis into the xy plane. Once in the transverse plane the magnetization is suppressed by a large dephasing gradient. The magnetization is still present, it just does not add up coherently to produce a signal. FIG. 19 shows the case of short-$T_2$ species. Short-$T_2$ species experience rapid $T_2$ relaxation in addition to the long, low amplitude, excitation pulse. If the rate at which transverse magnetization decays is faster than the rate at which it is created by the excitation pulse, the magnetization vector never leaves the $+z$ axis. The result is that the short-$T_2$ magnetization is left unchanged by the preparation pulse. Since there is no transverse magnetization component, the subsequent dephasing gradient has no effect on the short-$T_2$ magnetization.

The selectivity of the contrast as a function of $T_2$ is dependent on the shape of the pulse used for the preparation pulse. In general the $T_2$ sensitivity profile must be calculated numerically. However, there is an interesting pulse for which the sensitivity profile can be calculated analytically. That is for the rectangular pulse.

Consider the analytical solution for the contrast produced by a rectangular $\pi/2$ RF pulse followed by a large dephasing gradient. We are only interested in the residual $M_z$ magnetization, since we are assuming that all $M_z$ magnetization is subsequently dephased. The rotating frame Bloch equation for this case, neglecting $T_1$, is $$\begin{pmatrix} \dot{M}_x \\ \dot{M}_y \\ \dot{M}_z \end{pmatrix} = \begin{pmatrix} -\frac{1}{T_2} & 0 & 0 \\ 0 & -\frac{1}{T_2} & \gamma B_1 \\ 0 & -\gamma B_1 & 0 \end{pmatrix} \begin{pmatrix} M_x \\ M_y \\ M_z \end{pmatrix}. \quad [8]$$

The $M_x$ equation is uncoupled with the other two, and may be neglected. If we define $\omega_1 = \gamma B_1$ and $S_2 = 1/T_2$ we can write $$\begin{pmatrix} \dot{M}_y \\ \dot{M}_z \end{pmatrix} = \begin{pmatrix} -s_2 & \omega_1 \\ -\omega_1 & 0 \end{pmatrix} \begin{pmatrix} M_y \\ M_z \end{pmatrix}. \quad [9]$$

We are only interested in the solution for $M_z$. This may be calculated to be $$M_z = \frac{1}{s_a - s_b} [(s_a + s_2)e^{-s_a T} - (s_b + s_2)e^{-s_b T}]. \quad [10]$$

where $$s_{a,b} = -\frac{s_2}{2} \pm \sqrt{\left(\frac{s_2}{2}\right)^2 - \omega_1^2}, \quad [11]$$

and T is the length of the rectangular pulse. The long $T_2$ species are rotated by an angle of $\pi/2$, so the RF amplitude is $$\omega_1 = 2/T\pi \quad [12]$$

Substituting Equations 11 and 12 into Equation 10 and simplifying we get the expression $$M_z = e^{-\frac{\pi}{2}\left(\frac{T}{\pi T_2}\right)} \left\{ \frac{T/\pi T_2}{\sqrt{\left(\frac{T}{\pi T_2}\right)^2 - 1}} \sinh\left(\frac{\pi}{2}\sqrt{\left(\frac{T}{\pi T_2}\right)^2 - 1}\right) + \cosh\left(\frac{\pi}{2}\sqrt{\left(\frac{T}{\pi T_2}\right)^2 - 1}\right) \right\} \quad [13]$$

Figure 20:
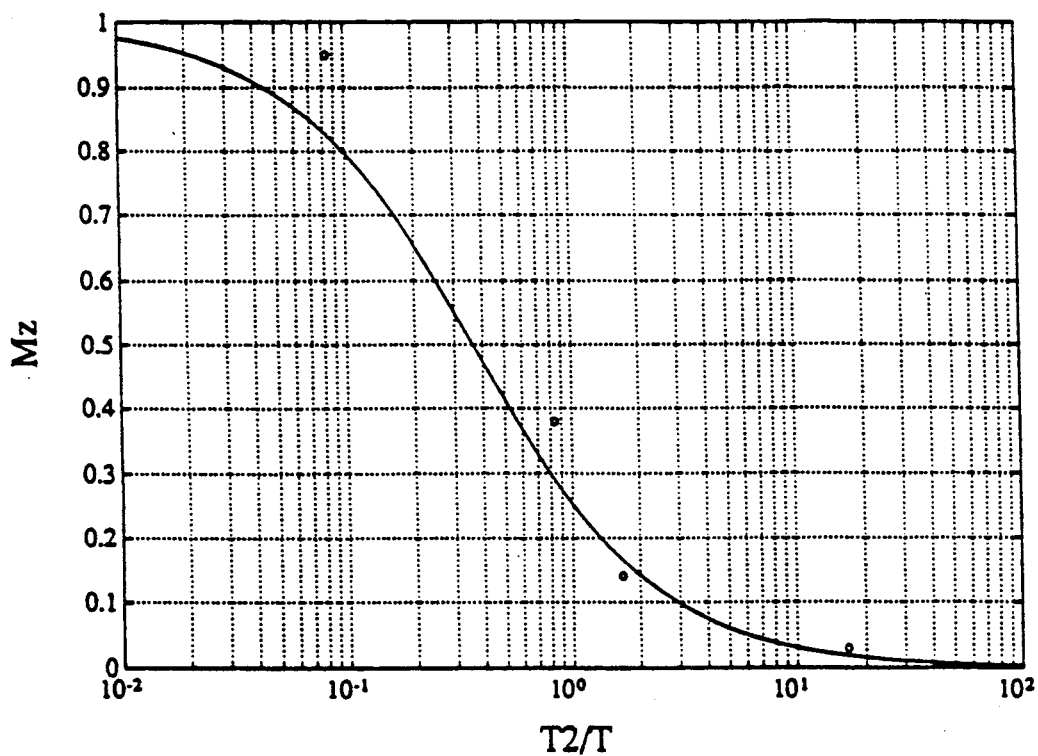
FIG. 20 is a graph of short $T_2$ contrast selectivity for a rectangular $\pi/2$ pulse as a function of the $T_2$ normalized by the pulse length T.

This expression is plotted as function of $T_2/T$ in FIG. 20. The plot shows that species with $T_2$'s a factor of 10 less than the pulse length are unaffected by the pulse, while $T_2$'s on the order of the pulse length or longer are substantially suppressed.

Figure 21A:
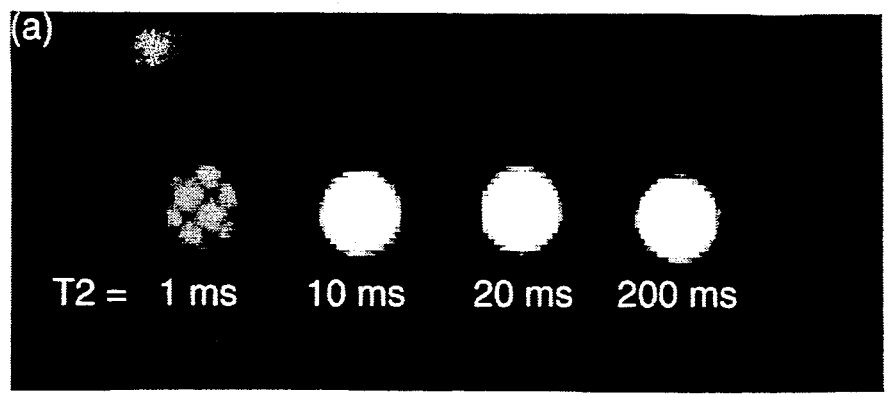
FIGS. 21A and 21B are images of species having different $T_2$ species taken without a contrast preparation pulse and with a contrast preparation pulse, respectively.
Figure 21B:

An experiment was performed to demonstrate the effectiveness of the short-$T_2$ contrast preparation pulse. The results are shown in FIGS. 21A and 21B. The pulse sequence of FIG. 17 was used with and without a 12 ms rectangular short-$T_2$ contrast preparation pulse. The phantom consists of four test tubes oriented perpendicular to the image plane, so the test tubes are imaged in cross-section. The test tubes are filled with distilled water doped with $CuSO_4$ to $T_2$'s of 1, 10, 20, and 200 ms. The image without the contrast preparation pulse is shown in FIG. 21A. The signal from the 1 ms test tube is less than the others because some signal decay occurs during the 250 μs delay between excitation and acquisition. The image with the short-$T_2$ contrast preparation pulse is shown in FIG. 21B. The 200 ms test tube is almost completely suppressed, while the 1 ms test tube is almost completely unaffected. The ratio of the intensities with and without the contrast preparation pulse are plotted as circles on the plot in FIG. 20. The agreement between the predicted and experimental data is good.

One important consideration with the contrast method of the invention is that a long excitation pulse will have a narrow bandwidth. In practice the bandwidth of the pulse should be chosen to be larger than the frequency variation due to imhomongeneity of the main magnetic field. It will probably not be wide enough to guarantee the excitation of both water and lipid components. In general the long $T_2$ species of both of these components should be suppressed. This can be done with two sequential preparation pulses, or by one pulse designed to excite both spectral components at the same time. For example, for the rectangular pulse the RF waveform to excite both water and fat would be $$\gamma B_1(t) = (1 + e^{\omega}) \pi/2T \quad [14]$$

where the excitation is at the water frequency and $\omega_1$ is the lipid (or fat) chemical shift. This is effectively two rectangular RF pulses played out at the same time, one at the water frequency and one at the fat frequency. Some care must be exercised with either the sequential or simultaneous methods since the short-$T_2$ species effectively see both pulses, and will experience a suppression that is the product of the two individual suppressions.

Conclusion

The present invention presents a new slice selective excitation pulse which allows very short $T_2$ species to be imaged without any penalty in slice profile and with improved contrast. The experimental images show both that the slice profile is the same as that for conventional slice-selective excitation, and that $T_2$ species on the order of 1 ms can easily be imaged on a commercial imaging system.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

We claim:

1. A method of obtaining slice-selective magnetic resonance signals for imaging short $T_2$ species while suppressing longer $T_2$ species comprising the steps of
   (a) applying a static magnetic field ($B_o$) to a body thereby aligning nuclear spins,
   (b) applying an RF pulse to said body, said RF pulse having sufficient amplitude to excite the longer $T_2$ species but insufficient amplitude to excite the short $T_2$ species,
   (c) applying a modulated magnetic gradient (G(t)) to said body,
   (d) applying a first RF excitation pulse ($B_1(t)$) to said body to tip said nuclear spins,
   (e) detecting first magnetic resonance signals from said body,
   (f) applying a second RF excitation pulse ($B_1(t)$) to said body to tip said nuclear spins, said first RF excitation to pulse and said second RF excitation pulse each being half of a conventional slice-selective pulse,
   (g) detecting second magnetic resonance signals from said body, and
   (h) combining said first magnetic resonance signals and said second magnetic resonance signals.

2. The method as defined by claim 1 wherein each of said RF excitation pulses is slewed to zero at a slew rate, S, and said modulated magnetic gradient is slewed to zero as each of said RF excitation pulses is slewed to zero.

3. The method as defined by claim 2 wherein said modulated magnetic gradient is $$G(t) = \begin{cases} G_0 & t \leq -\dfrac{G_0}{S} \\ -St & -\dfrac{G_0}{S} < t \leq 0 \end{cases}$$

and each of said RF excitation pulses is $$B_1'(t) = \begin{cases} B_1\left(t - \dfrac{3G_0}{2S}\right) & t \leq -\dfrac{G_0}{S} \\ B_1\left(\dfrac{St^2}{G_0}\right)\left|\dfrac{St}{G_0}\right| & -\dfrac{G_0}{S} < t \leq 0 \end{cases}$$

4. The method as defined by claim 1 wherein step (b) tips the longer $T_2$ species away from one axis while the short $T_2$ species remain aligned along said one axis.

5. The method as defined by claim 4 wherein step (b) further includes applying a magnetic gradient along said one axis thereby dephasing the longer $T_2$ species.

6. Apparatus for obtaining slice-selective magnetic resonance signals for imaging short $T_2$ species comprising
  (a) means for applying a static magnetic field ($B_o$) to a body thereby aligning nuclear spins,
  (b) applying an RF pulse to said body, said RF pulse having sufficient amplitude to excite the longer $T_2$ species but insufficient amplitude to excite the short $T_2$ species,
  (c) means for applying a modulated magnetic gradient (G(t)) to said body,
  (d) means for applying a first RF excitation pulse ($B_1(t)$) to said body to tip said nuclear spins,
  (e) means for detecting first magnetic resonance signals from said body,
  (f) means for applying a second RF excitation pulse ($B_1(t)$) to said body to tip said nuclear spins, said first RF excitation pulse and said second RF excitation pulse each being half of a conventional slice-selective pulse,
  (g) means for detecting second magnetic resonance signals from said body, and
  (h) means for combining said first magnetic resonance signals and said second magnetic resonance signals.

7. Apparatus as defined by claim 6 wherein each of said RF excitation pulses is slewed to zero at a slew rate, S, and said modulated magnetic gradient is slewed to zero as each of said RF excitation pulses is slewed to zero.

8. Apparatus as defined by claim 7 wherein said modulated magnetic gradient is $$G(t) = \begin{cases} G_0 & t \leq -\dfrac{G_0}{S} \\ -St & -\dfrac{G_0}{S} < t \leq 0 \end{cases}$$

and each of said RF excitation pulses is $$B_1'(t) = \begin{cases} B_1\left(t - \dfrac{3G_0}{2S}\right) & t \leq -\dfrac{G_0}{S} \\ B_1\left(\dfrac{St^2}{G_0}\right)\left|\dfrac{St}{G_0}\right| & -\dfrac{G_0}{S} < t \leq 0 \end{cases}$$

9. Apparatus as defined by claim 6 wherein said (b) means tips the longer $T_2$ species away from one axis while the short $T_2$ species remain aligned along said one axis.

10. Apparatus as defined by claim 9 and further including means for applying a magnetic gradient along said one axis after said RF pulse is applied to said body thereby dephasing the longer $T_2$ species.

11. In imaging short $T_2$ species in a body while suppressing longer $T_2$ species in the body using magnetic resonance imaging, a method on enhancing image contrast between the short $T_2$ species and the longer $T_2$ species comprising the steps of
  (a) applying a static magnetic field ($B_o$) to the body thereby aligning nuclei along an axis (z),
  (b) applying an RF pulse to said body, said RF pulse having sufficient amplitude to excite the longer $T_2$ species but insufficient amplitude to excite the short $T_2$ species, whereby nuclei of the longer $T_2$ species are tipped away from said axis while the short $T_2$ species remain aligned along said axis, and
  (c) thereafter detecting magnetic resonance signals for imaging the short $T_2$ species.

12. The method as defined by claim 11 and including after step (b) the step of applying a magnetic gradient along said one axis thereby dephasing the longer $T_2$ species nuclei.

* * * * *